(12) United States Patent
Lenchenkov

(10) Patent No.: US 7,923,799 B2
(45) Date of Patent: Apr. 12, 2011

(54) IMAGE SENSORS WITH LIGHT GUIDES

(75) Inventor: Victor Lenchenkov, Sunnyvale, CA (US)

(73) Assignee: Aptina Imaging Corporation, George Town (KY)

( * ) Notice: Subject to any disclaimer, the term of this patent is extended or adjusted under 35 U.S.C. 154(b) by 101 days.

(21) Appl. No.: 12/481,068

(22) Filed: Jun. 9, 2009

(65) Prior Publication Data
US 2010/0308427 A1 Dec. 9, 2010

(51) Int. Cl.
*H01L 31/0232* (2006.01)
(52) U.S. Cl. .......... 257/432; 257/436; 257/E31.127
(58) Field of Classification Search ............ 257/432, 257/436, E31.127
See application file for complete search history.

(56) References Cited

U.S. PATENT DOCUMENTS

| | | | |
|---|---|---|---|
| 6,108,461 A | 8/2000 | Haga | |
| 6,969,899 B2 | 11/2005 | Yaung et al. | |
| 7,358,583 B2 | 4/2008 | Reznik et al. | |
| 2005/0236553 A1* | 10/2005 | Noto et al. | 250/208.1 |
| 2006/0038252 A1 | 2/2006 | Mouli | |
| 2008/0210851 A1* | 9/2008 | Arnold | 250/221 |

* cited by examiner

*Primary Examiner* — Thien F Tran
(74) *Attorney, Agent, or Firm* — Treyz Law Group; G. Victor Treyz; David C. Kellogg

(57) ABSTRACT

An image sensor may be formed from a planar semiconductor substrate. The image sensor may have an array of pixels. Each pixel may have a photosensitive element that is formed in the substrate and may have a light guide in a dielectric stack that guides light from a microlens and color filter to the photosensitive element. The light guides in pixels that are offset from the center of the image sensor may be tilted so that their longitudinal axes each form a non-zero angle with a vertical axis that lies perpendicular to the planar semiconductor substrate. These light guides may have laterally elongated openings that help collect light. A light guide may have a lower opening that matches the size of an associated photosensitive element. Photosensitive elements that are laterally offset from the center of the image sensor may be tilted. Pixels of different colors may have off-center photosensitive elements.

17 Claims, 9 Drawing Sheets

IMAGE SENSORS WITH LIGHT GUIDES

BACKGROUND

The present invention relates to image sensors and, more particularly, to image sensors with light guide structures.

Electronic devices such as cellular telephones are often provided with digital image sensors. A typical image sensor has an array of pixels each of which has a photosensitive element such as a photodiode. Image sensor pixel arrays may contain thousands or millions of pixels. To ensure satisfactory image quality, each pixel should convert image light into electrons efficiently with low cross-talk. These challenges have been partly addressed by incorporating light guide structures into conventional image sensor pixels. During fabrication, light guide openings are etched through the surface dielectric layers on an image sensor. These openings are then filled with material having an elevated index of refraction. Light guide structures that are formed in this way help to channel incoming light to the photosensitive elements of the pixels. However, image sensors with conventional light guide structures are sometimes prone to cross-talk and could benefit from improved conversion efficiencies.

DETAILED DESCRIPTION

Figure 1:
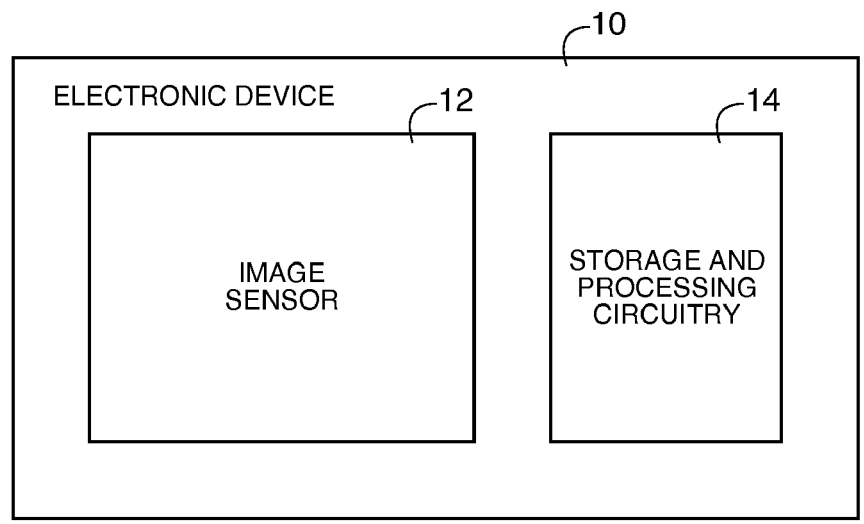
FIG. 1 is a diagram of an electronic device with an image sensor that may be provided with light guide structures in accordance with an embodiment of the present invention.

Digital image sensors are widely used in electronic devices. An electronic device 10 with an image sensor 12 and storage and processing circuitry 14 is shown in FIG. 1. Electronic device 10 may be a digital camera, a computer, a cellular telephone, or other electronic device. Image sensor 12 may be part of a camera module that includes a lens or may be provided in a more complex electronic device that has a separate lens. During operation, the lens focuses light onto image sensor 12. The pixels in image sensor 12 include photosensitive elements that convert the light into digital data. Image sensors may have any number of pixels (e.g., hundreds or thousands or more). A typical image sensor may, for example, have millions of pixels (e.g., megapixels).

Image data from image sensor 12 may be provided to storage and processing circuitry 14. Storage and processing circuitry 14 may process the digital image data that has been captured with sensor 12. The processed image data may be maintained in storage. The processed image data may also be provided to external equipment. Storage and processing circuitry 14 may include storage components such as memory integrated circuits, memory that is part of other integrated circuits such as microprocessors, digital signal processors, or application specific integrated circuits, hard disk storage, solid state disk drive storage, removable media, or other storage circuitry. Processing circuitry in storage and processing circuitry 14 may be based on one or more integrated circuits such as microprocessors, microcontrollers, digital signal processors, application-specific integrated circuits, image processors that are incorporated into camera modules, other hardware-based image processing circuits, combinations of these circuits, etc.

The quality of the images that are captured by image sensor 12 is influenced by a variety of factors. For example, the quality of the lens that is used to focus image light onto the image sensor may have an impact on image quality. The size of the pixel array in image sensor 12 may also have an impact on image quality. Large image sensors with large numbers of image pixels will generally be able to produce images with higher quality than smaller image sensors having fewer image pixels. Image quality is also affected by the performance of the individual pixels in the image array. Image arrays with poorly designed image pixels will not be efficient at collecting light and converting the collected light into electrical signals. Image arrays such as these may be prone to noise and cross-talk. Conventional image arrays tend not to take account of problems that can reduce image quality such as unoptimized pixels.

In sensor 12 of FIG. 1, image quality may be enhanced by collecting light efficiently at each image array pixel and by locating photosensitive elements within each image pixel so as to reduce cross-talk. For example, light guide structures may be provided within image sensor 12 that help to collect light and to route the collected light to photosensitive elements. The light guide structures in a given array need not all have the same size, shape, and location within a pixel. This allows the light guide structures to be optimized based on their position within the image sensor.

Figure 2:
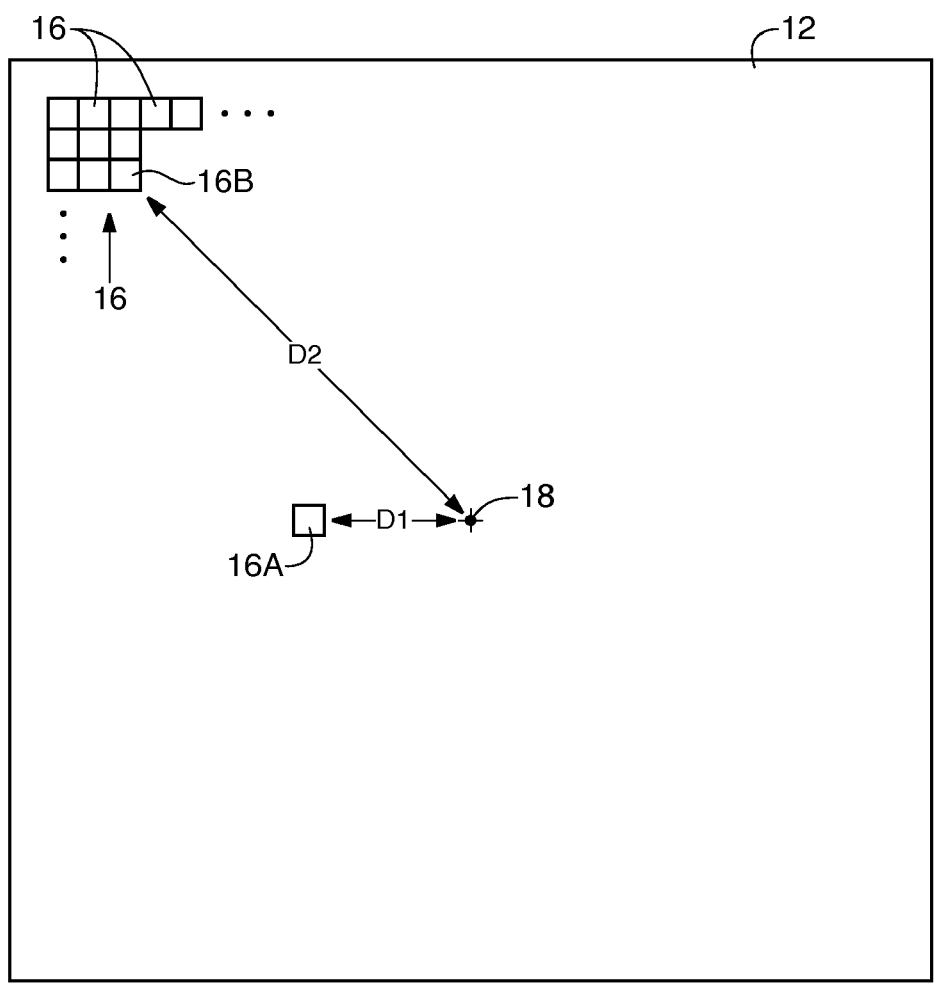
FIG. 2 is a top view of an illustrative image sensor showing how different pixels may have different corresponding distances from the center of the image sensor in accordance with an embodiment of the present invention.

An illustrative image sensor 12 is shown in FIG. 2. As shown in FIG. 2, sensor 12 has an array of image pixels 16. Pixels 16 are typically organized in rows and columns. Each pixel contains a photosensitive element such as a photodiode and corresponding electrical components (e.g., transistors, charge storage elements, and interconnect lines for routing electrical signals). A typical pixel may include a microlens and a color filter. The microlens in a pixel gathers light from the main lens in the electronic device and focuses the light onto the photosensitive element of the pixel through the color filter. There are typically several different color filters in the array. For example, image sensors that are based on the well-known Bayer pattern contain red, green, and blue color filters.

Image sensor 12 of FIG. 2 has a center point 18. Image pixels 16 are located at various distances from center point 18. For example, image pixel 16A is located at a distance D1 from image sensor center 18 and image pixel 16B is located at a distance D2 from image sensor center 18. Because the lens of electronic device 10 (sometimes referred to as the camera lens) is located at a position that is centered with respect to image sensor 18, light rays that are focused onto peripheral image pixels such as image pixel 16B tend to be more angled with respect to the plane of image sensor 18 than light rays that are focused onto more centrally located image pixels such as image pixel 16A. As a result, the shape of the light spot that is focused onto the surface of the photosensitive element by the microlens in a given pixel tends to depend on the location of the pixel within image array 12. In pixels near center 18, the microlens in each pixel will produce a focused light spot of circular or near circular shape. In pixels farther from center 18, the microlens in each pixel will produce a focused light spot with a more elongated shape (e.g., an oval).

Figure 3:
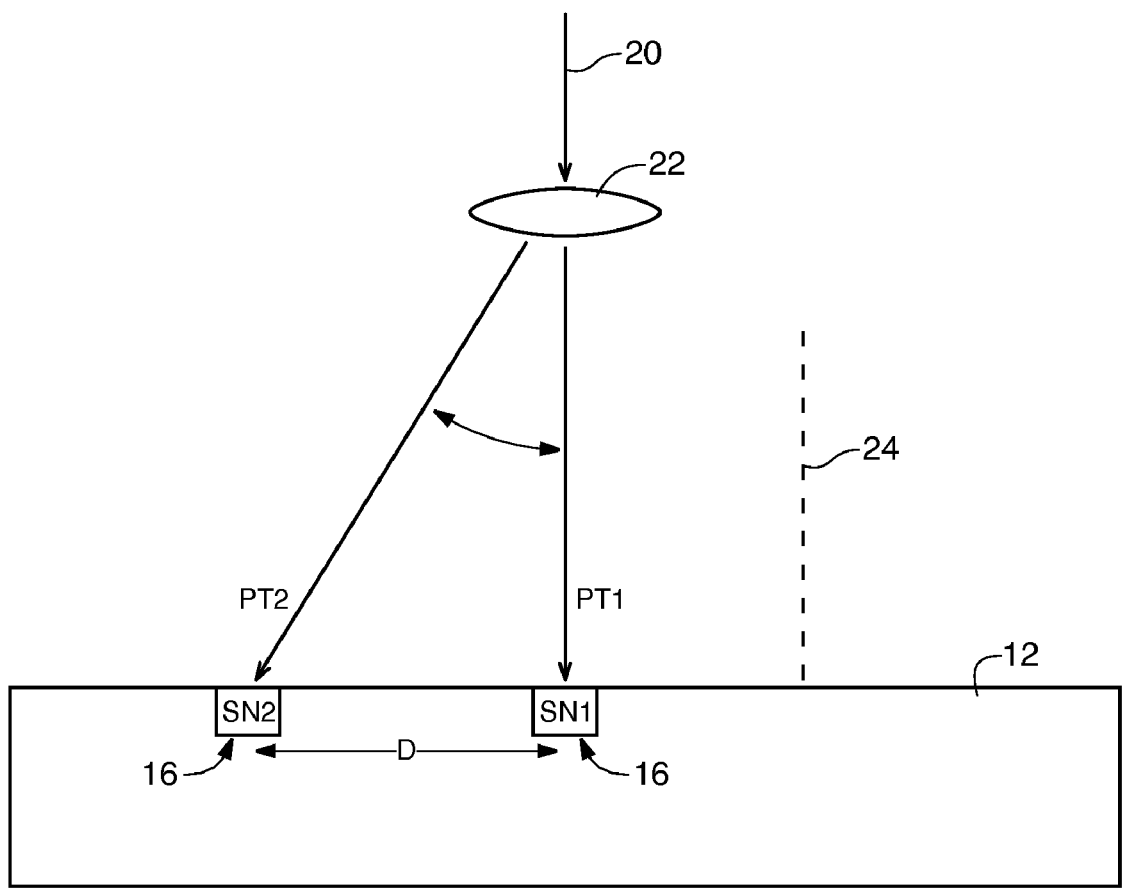
FIG. 3 is a side view of an image sensor pixel on an image sensor showing how the image sensor pixel may receive incoming light at an angle that depends on the distance of that image sensor pixel from the center of the image sensor in accordance with an embodiment of the present invention.

A cross-sectional side view of sensor 12 that illustrates this spreading effect is shown in FIG. 3. As shown in FIG. 3, camera lens 22 may receive incoming light 20 corresponding to an image. Lens 22 may be a single element lens, a compound lens, a lens that is separate from a camera module, or a lens that is integrated into a camera module. As incoming light 20 is focused onto the surface of image sensor 12 by lens 22, some light rays strike the surface of sensor 12 at right angles, whereas other light rays strike the surface of sensor 12 at more oblique angles. In the example of FIG. 3, pixel SN1 receives light along path PT1 (e.g., light oriented at a 90° angle with respect to the planar surface of sensor 12 and parallel to normal axis 24). Pixel SN2 receives light along path PT2 at a non-zero angle with respect to axis 24. Because of the more oblique angle of path PT2 relative to the angle of path PT1, the light that is focused onto the photosensitive element of pixel SN2 by its microlens will tend to have an oval shape, whereas the light that is focused onto the surface of the photosensitive element pixel SN1 will have a smaller circular area.

Image sensors are generally formed from semiconductor substrates such as silicon wafers. Layers of dielectric are formed on the surface of the silicon substrate. These layers of dielectric are sometimes referred to as a dielectric stack. Structures such as color filters and microlenses may be formed on top of the dielectric stack. The dielectric stack typically contains "metal layers" in which metal interconnect lines are formed. Via layers in the dielectric stack may be interposed between metal layers. Each via layer may contain conductive vertical conductors (sometimes referred to as vias) that electrically connect corresponding interconnects in respective metal layers. The pattern of metal lines in the dielectric stack is configured so as not to significantly impede light that is being focused onto the photosensitive element. Light can also be routed to the photosensitive element using light guide structures.

Figure 4:
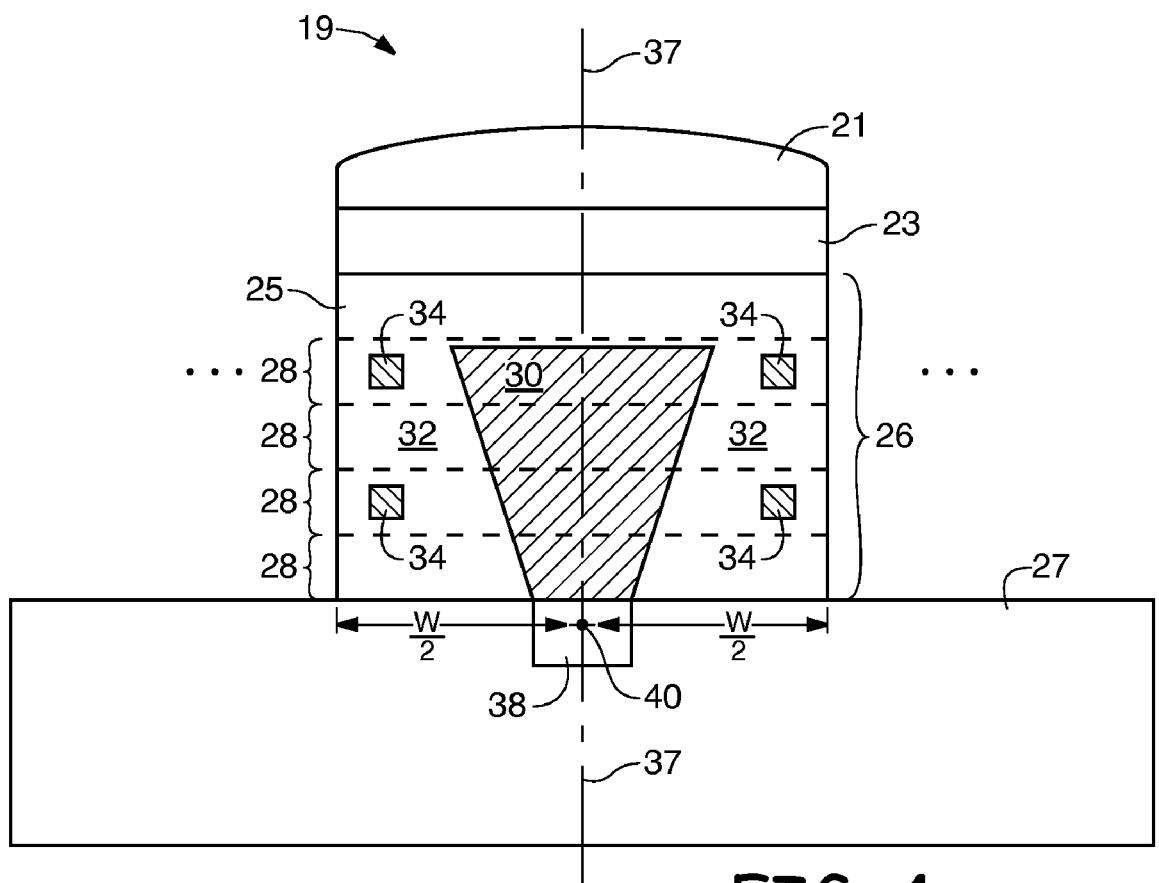
FIG. 4 is a cross-sectional side view of a conventional image sensor pixel having a light guide.

A cross-sectional diagram of a conventional pixel is shown in FIG. 4. As shown in FIG. 4, pixel 19 may include a photosensitive element 38 (photodiode) formed in silicon substrate 27. Dielectric stack 26 may include dielectric layers 28. Layers 28 may be formed from silicon dioxide and may include alternating "metal layers" and "via layers." Metal lines and vias (interconnects 34) may be formed in dielectric stack 26. A passivation layer 25 such as a layer of silicon nitride may be provided at the top of dielectric stack 26. Color filter 23 may be formed on top of dielectric stack 26. In a Bayer pattern filter array, color filter 23 may be red, blue, or green. Microlens 21 may be formed on the top of color filter 23. During operation of the image sensor, incoming light is focused by microlens 21 onto the surface of photosensitive element 38.

Light guide 30 is used to help guide light from microlens 21 to photosensitive element 38. Light guide 30 is formed by etching a hole in the dielectric stack 26 and filling the hole with a material that has a higher index of refraction than the principal dielectric of layers 28. The elevated index of refraction of the light guide forms a waveguide structure that contains light along axis 37. Metal interconnect structures 34 are formed in region 32 in the lower index of refraction portion of stack 26, outside of the light-confining core of guide 30. As a result of the confinement of the light within light guide 30, light does not intrude significantly into region 32, thereby reducing scattering losses due to light interaction with interconnects 34.

With conventional pixel arrangements such as the arrangement of pixel 19 of FIG. 4, light guide 30 has a longitudinal axis that is substantially coaxial with longitudinal axis 37 of pixel 19. Photosensitive element 38 has a center 40 that is aligned with axis 37 (e.g., so that center 40 is a distance W/2 from each edge of pixel 19. At the surface of substrate 27, photosensitive element 38 may be square. While this type of symmetric arrangement may be satisfactory for central pixel locations, pixel locations that are off-axis (i.e., at a non-zero distance D from the center of the image sensor) will receive light at an angle. Because the incoming light is angled, the focused light at the surface of substrate 27 will form an oval-shaped spot. The oval-shaped spot may exhibit substantial mismatch with the photosensitive area of photosensitive element 38. This will lead to reduced light gathering efficiency (low quantum efficiency).

Figure 5:
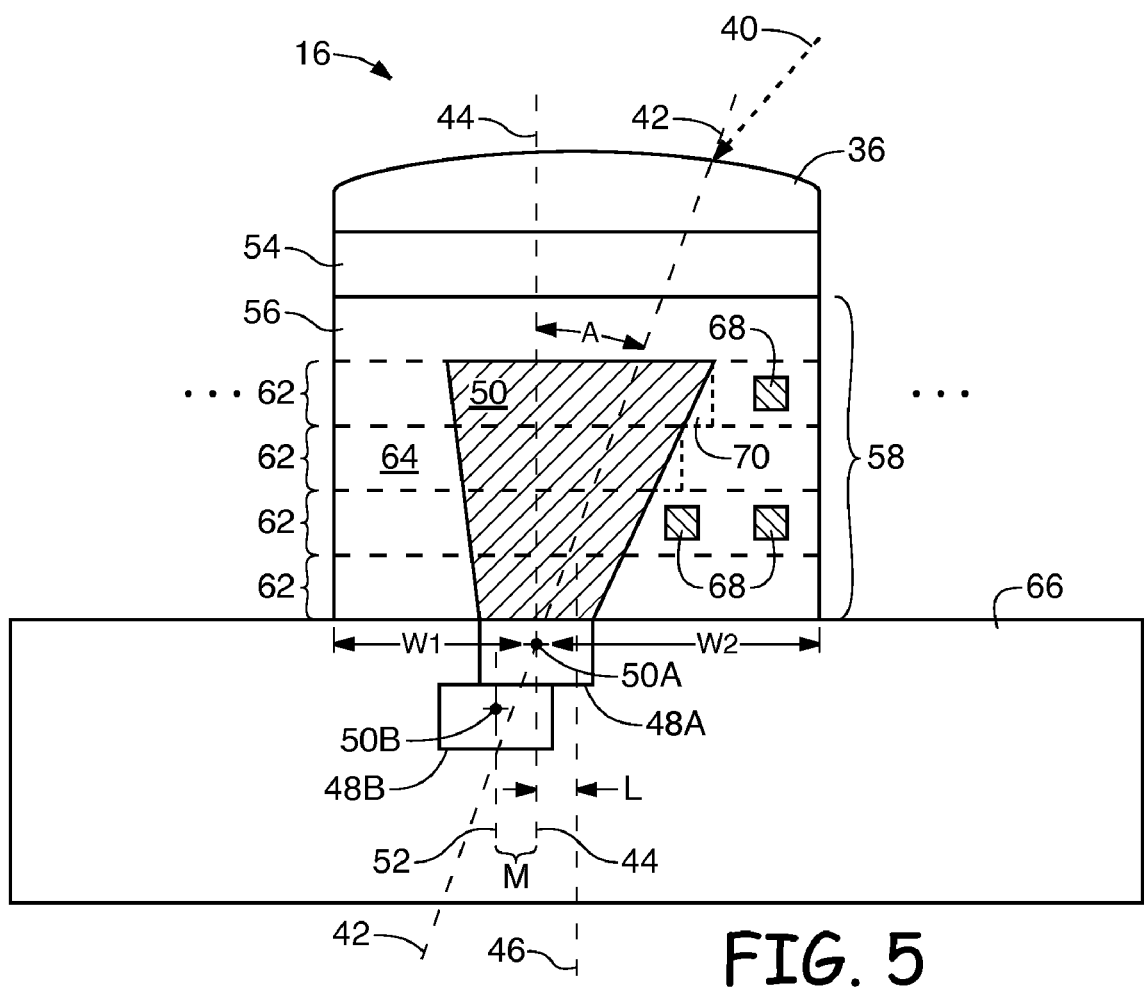
FIG. 5 is a cross-sectional side view of an image sensor pixel with light guide structures in accordance with an embodiment of the present invention.

A pixel 16 of the type that may be used to improve image sensor performance in device 10 is shown in FIG. 5. As shown in FIG. 5, image sensor pixel 16 may be formed on a semiconductor substrate such as silicon substrate 66. Pixel 16 may include structures formed in dielectric stack 58. Dielectric stack 58 may include layers of dielectric such as silicon oxide, silicon nitride, mixtures of oxide and nitride, spin-on glass materials, titanium oxide, or other dielectrics. There may be a number of dielectric layers 62 in stack 58 (e.g., two or more layers 62, three or more layers 62, etc.). If desired, dielectric stack 58 may include a passivation layer such as silicon nitride layer 56. Color filter 54 may be formed on dielectric stack 58. Microlens 36 may be used to focus incoming light. Layers 62 may include alternating metal layers (i.e., dielectric layers that contain metal interconnect lines or other suitable conductive interconnect lines) and via layers (i.e., dielectric layers that contain metal vias or other conductive vertical interconnect structures). As shown in FIG. 5, interconnects 68 may be located at least partly under portion of light guide 60, particularly when light guide 60 is tilted with respect to the vertical axis of pixel 16.

Light guide 60 may be formed by forming a sequence of openings in layers 62 and by filling these openings with a dielectric material that has an index of refraction that is elevated with respect to the remaining dielectric in layers 62 (i.e., the dielectric in regions 64 outside of the center of light guide 60).

Light guide 60 may have a longitudinal axis 42 that is oriented at an angle A with respect to vertical axis 44 and that is aligned with the high-index-of-refraction portions of layers 62. Although light guide 60 is shown as having a conical shape in the example of FIG. 5, light guide 60 may, if desired, be formed from a series of individual etch and refill steps. With this type of arrangement, each layer 62 in dielectric stack 58 may be provided with light guide layer having a different outline. This may result in a staircase-shaped cross-sectional outline for light guide 60, as indicated by the partial set of dotted lines 70 in the upper right side of light guide 60 of FIG. 5.

In image sensor 12, each pixel 16 may be fabricated so that its angle A has an optimum magnitude. Pixels near the center of the image sensor may have angles A that are smaller than the angles of pixels that are farther from the center of the image sensor. With this type of arrangement, pixels that are near the center of the image sensor and that handle light with paths such as path PT1 of FIG. 3 may be provided with light guides 60 having their longitudinal axis aligned vertically with axis 44, whereas pixels that are located farther from the center of the image sensor and that handle light with paths such as path PT2 of FIG. 3 may be provided with light guides 60 that are angled at a non-zero angle A. This allows incoming light 40 from the camera lens to be directed towards the photosensitive element of pixel 16 along longitudinal axis 42 of light guide 60. If a conventional vertically oriented light guide were to be used in off-axis pixels, some of the light could leak out of the light guide and scatter from the interconnect structure in the pixel.

Light may be converted into a sensor signal (electric charge) using a photosensitive element. The photosensitive element may be formed from a single-layer photodiode or, if desired, a multi-layer structure may be used. In the example of FIG. 5, there are two light sensitive portions to the photosensitive element: photosensitive element 48A and photosensitive element 48B. This is merely illustrative. There may, in general, be any number of photodiode layers in the photosensitive element for pixel 16 (e.g., one layer, two layers, three layers, more than three layers, etc.). Each layer of the photosensitive element may include a doped region (e.g., an n-type region) surrounded by well structures (e.g., p+ regions). A transistor gate may be used to control the flow of charge from the photosensitive element to a charge storage element (e.g., a floating diffusion that serves as part of a capacitor).

As with light guide 60, the layers of the photosensitive element may be arranged in vertical alignment for pixels 16 that are located at the center of sensor 12. In pixels 16 that lie farther from the center of the image sensor 12, the layers of the photosensitive element may have offset centers. For example, upper element 48A may be have a center point 50A and center axis 44 that is offset by a distance L with respect to the center axis 46 of pixel 16 and lower element 48B may have a center point 50B and center axis 52 that is offset by a distance M with respect to central axis 44 of photosensitive element 48A. These offsets allow the tilt of the photosensitive element to be adjusted to match the tilt of the incoming light (e.g., light 40 that is guided along axis 42 by microlens 36 and light guide 60. The match between the tilted longitudinal axis of the tilted photosensitive element (structures 48A and 48B) and the tilt of light guide 60 and incoming light ray 42 helps to avoid undesired mismatch between the incoming light rays and the photosensitive structures of pixel 16.

Figure 6:
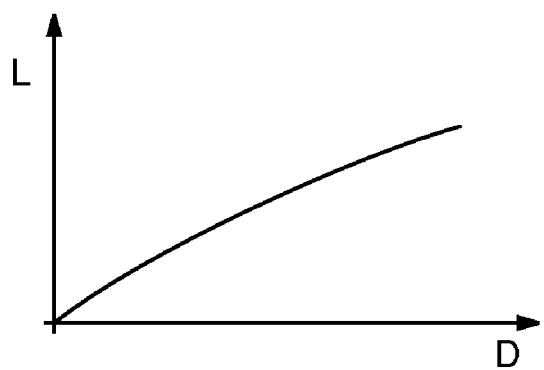
FIG. 6 is a graph showing how the offset of a photosensitive element with respect to the center of the image sensor pixel in which it is contained may vary as a function of the distance of the image sensor pixel from the center of an image sensor array in accordance with an embodiment of the present invention.
Figure 7:
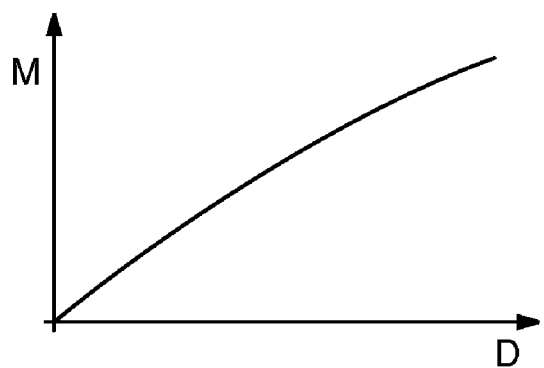
FIG. 7 is a graph showing how the offset of a lower-level photosensitive element layer with respect to the center of an overlying photosensitive element structure may vary as a function of distance from the center of an image sensor array in accordance with an embodiment of the present invention.
Figure 8:
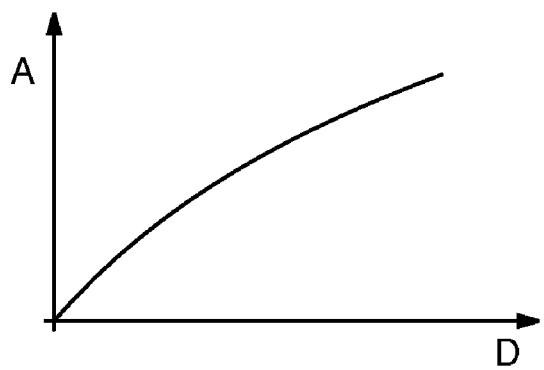
FIG. 8 is a graph showing how the angle at which incoming light enters image sensor pixels varies as a function of distance from the center of an image sensor array in accordance with an embodiment of the present invention.

The way in which the dimensions of pixels 16 of the type shown in FIG. 5 can be varied as a function of distance from the center of image sensor 12 is shown in FIGS. 6, 7, and 8.

FIG. 6 illustrates how the amount of lateral offset L of the uppermost layer of the photosensitive element (e.g., the offset of photosensitive element structure 48A) may be adjusted as a function of pixel distance D from the image sensor center.

FIG. 7 illustrates how the amount of lateral offset M of lower layers of the photosensitive element (e.g., the offset of photosensitive element structure 48B from photosensitive element structure 48A) may be varied as a function of distance D.

The graph of FIG. 8 shows how the angle A of light guide 60 may be adjusted as a function of distance D from the image sensor center. With angled light guides, the shape of the light guide opening in the uppermost dielectric layer may become elongated (e.g., oval) in shape. At progressively larger distances D from the image sensor center, the amount of elongation of the light guide opening progressively increases (i.e., the elongation amount (i.e., the longer lateral dimension of the oval when the opening is oval in shape) may follow a monotonically increasing function of the type shown for angle A in FIG. 8.

The examples of FIGS. 6, 7, and 8 are merely illustrative. In general, any functional relationship may be used when varying the dimensions of the structures in pixel 16. It can be helpful to vary the angle of light guide 60 with a monotonically increasing function as shown in FIG. 6, because this improves the alignment between incoming light rays and the angle at which light guide 60 guides the light towards its destination (e.g., the upper surface of the photosensitive element). This may reduce light scattering from stray light striking interconnects 68 and may allow more interconnects 68 to be formed under the overhanging layers of light guide 60 in stack 58. It can be helpful to offset upper photosensitive element 48A as a monotonically increasing function of distance D as shown in FIG. 7 to align photosensitive element 48A with the exit of light guide 60. The formation of tilted photosensitive elements (e.g., by forming multiple layers of photosensitive structures such as multiple photodiode layers) may help increase sensor sensitivity (quantum efficiency) by increasing the path length of light rays within the photosensitive element.

Figure 9:
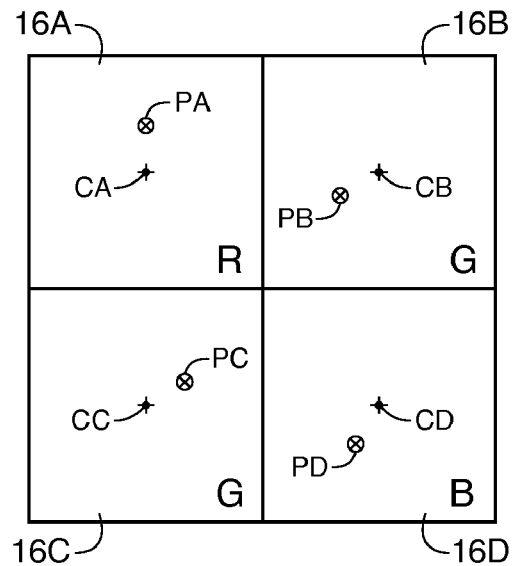
FIG. 9 is a top view of a section of an illustrative image sensor array showing how photosensitive elements may be located within image sensor pixels of different colors in accordance with an embodiment of the present invention.

If desired, positions of the photosensitive elements within the pixels of sensor 12 may be adjusted to decrease cross-talk between pixels and/or to increase pixel sensitivity. This type of arrangement is illustrated in the example of FIG. 9. FIG. 9 is a top view of a four-pixel section of an illustrative image sensor that has a pixel array with color filters that are arranged in a Bayer color filter array pattern. The four-pixel pattern of FIG. 9 is repeated over the entire sensor.

In a Bayer pattern, half of the rows (e.g., the odd rows) contain alternating green (G) and red (R) color filters and the other half of the rows (e.g., the even rows) contain alternating green and blue (B) color filters. As shown in FIG. 9, pixels 16B and 16C are a pair of adjoining green pixels. Pixels 16A and 16D are adjoining red and blue pixels. Pixel 16A is a red pixel and pixel 16D is a blue pixel. During light gathering operations, light that has passed through the red color filter may scatter and land within the photosensitive element associated with other pixels such as blue pixel 16D. To decrease this undesirable effect, the center of the photosensitive element of pixel 16A may be positioned at point PA, rather than pixel center CA and the center of the photosensitive element of pixel 16D may be positioned at point PD, rather than pixel center CD. By positioning the photosensitive elements in pixels 16A and 16D at an increased distance from each other, the chance of a scattered blue light ray striking the photosensitive element in the red pixel (and vice versa) is reduced, thereby reducing cross-talk noise.

To increase sensitivity in the green channel, the photosensitive elements associated with the green pixels may be moved closer to each other. For example, the photosensitive element for green pixel 16C may be positioned at point PC, rather than pixel center CC and the photosensitive element for green pixel 16B may be positioned at point CB, rather than pixel center CB. This decrease in the distance separating the photosensitive elements for pixels 16C and 16B helps to reduce noise in the green channel due to light fluctuations. There may be some light scattering that causes signals from one green pixel to be detected by the other green pixel, but because the two pixels are associated with the same color channel, this effect results in increased sensitivity for the combined pixel pair at the expense of a modest reduction in green channel resolution. If desired, the pixel placement adjustments of FIG. 9 may be made in combination with the location-based light-guide and photosensitive element arrangements described in connection with FIG. 5.

Figure 10A:
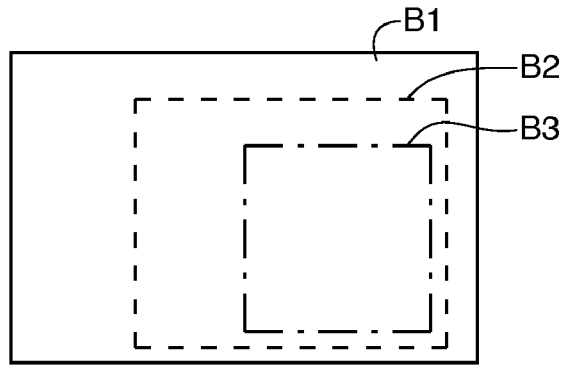
FIG. 10A is a top view of a light guide showing illustrative rectangular light guide openings that may be formed in various layers of a dielectric stack in accordance with an embodiment of the present invention.

A top view of an illustrative set of light guide layers in an angled light guide is shown in FIG. 10A. In the example of FIG. 10A, the upper most layer in the dielectric stack has a rectangular opening B1 that is filled with higher-index dielectric than the surrounding dielectric. In lower dielectric layers (i.e., dielectric layers within the dielectric stack that are closer to the silicon substrate surface), the openings that are filled with higher-index dielectric may be offset from the center of opening B1. For example, the opening B2 in the dielectric layer immediately below the layer that contains opening B1 may be formed from a rectangle that is changed in shape and that is offset from the center of opening B1. Opening B3 may be formed in the layer below the dielectric layer that contains opening B2. By nesting the successive openings within each other and by transitioning the size and shape of the openings, the resulting light guide may have a desired degree of tilt and may guide light to a desired exit size (B3 in the FIG. 10A example), even if the shape of the light spot at the top of the dielectric stack is elongated.

Figure 10B:
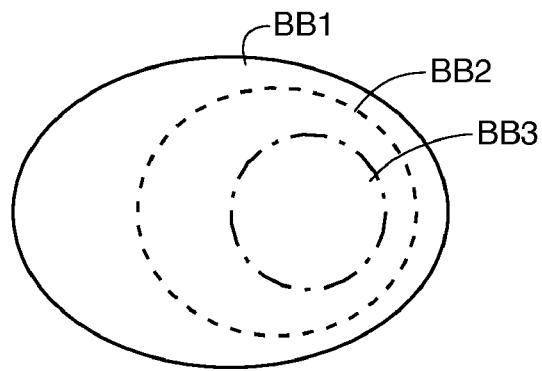
FIG. 10B is a top view of a light guide showing illustrative oval light guide openings that may be formed in various layers of a dielectric stack in accordance with an embodiment of the present invention.

FIG. 10B is a top view of an illustrative set of light guide openings that have an oval shape. At the uppermost layer, opening BB1 has an oval shape of the type that is appropriate for gathering light in a pixel that is at near the periphery of the image sensor (i.e., a pixel where incoming light forms an oval spot shape). Nested openings BB2 and BB3 in the layers below the layer that contains opening BB1 allows the shape of the light guide to transition from the oval shape that is optimal for gathering light from the microlens in the pixel to a round shape that is satisfactory for efficiently delivering light to a comparably sized and shaped photosensitive element (i.e., an element that is aligned with opening BB3 at the surface of the silicon substrate). If desired, other types of shapes may be used for pixel element light guides and other types of transitions may be used between the uppermost guide layers and the lowermost guide layer.

Figure 11A:
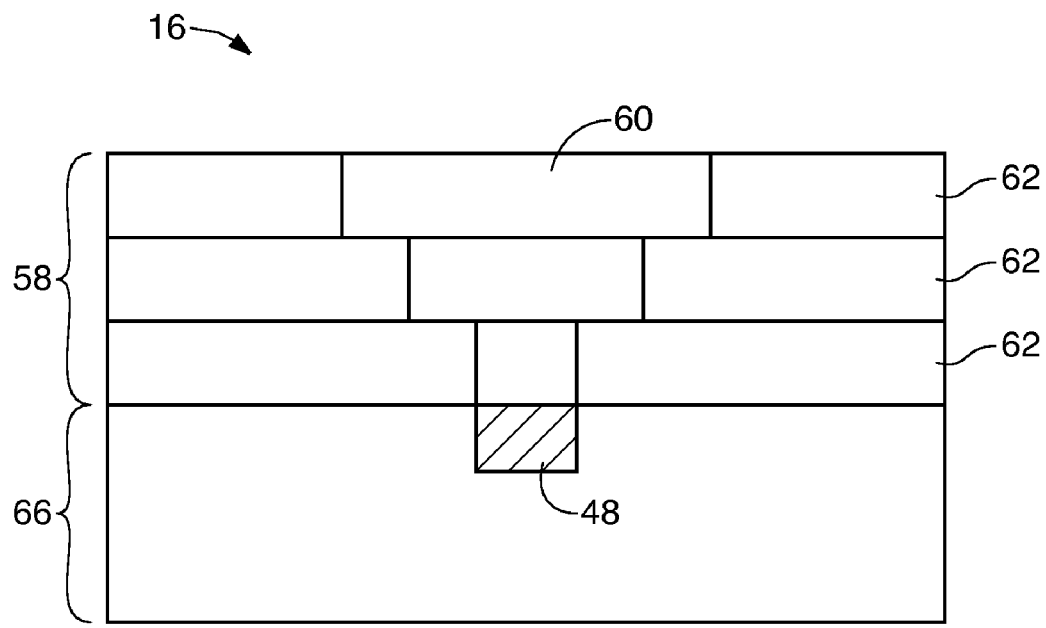
FIG. 11A is a cross-sectional side view of a portion of an illustrative image sensor pixel with light guide structures that guide light onto a relatively small photosensitive element in accordance with an embodiment of the present invention.
Figure 11B:
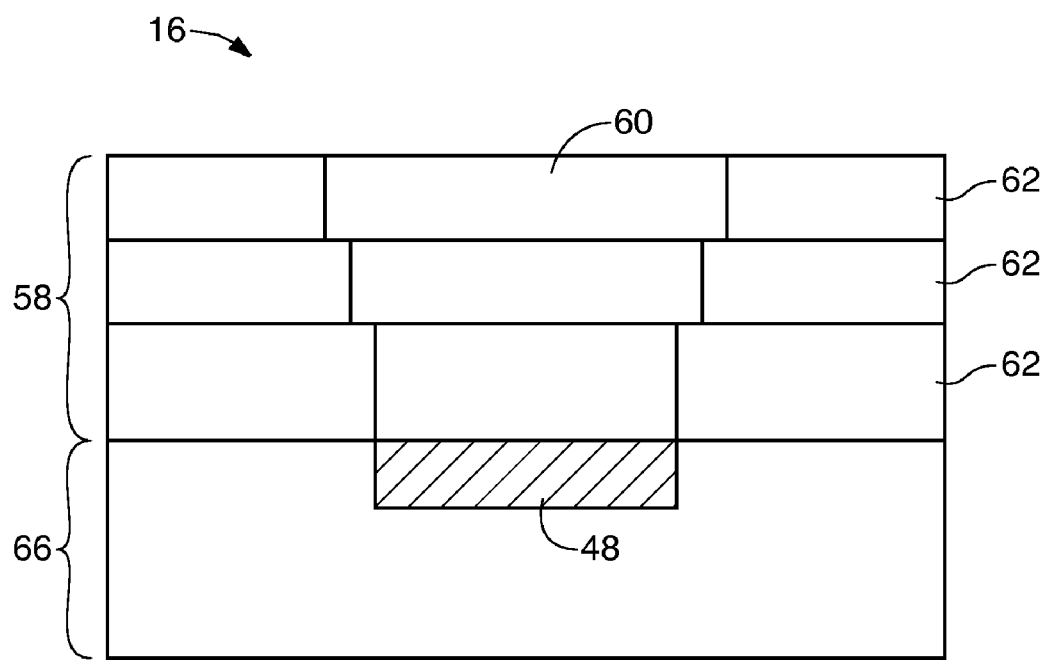
FIG. 11B is a cross-sectional side view of a portion of an illustrative image sensor pixel with light guide structures that guide light onto a relatively large photosensitive element in accordance with an embodiment of the present invention.

As shown in FIGS. 11A and 11B, the sidewalls of light guide 60 may be relatively shallow (e.g., when guiding light to a small photosensitive element 48 as in FIG. 11A) or may be relatively steep (e.g., when guiding light to a relatively large photosensitive element 48, as shown in FIG. 11B). The ability to tailor the exit size of light guide 60 to the size of its corresponding photosensitive element can help improve quantum efficiency. If desired, the lateral sizes (opening sizes) of the light guide layers may be adjusted to provide color filtering properties to pixel 16. For example, if the narrow light guide 60 of FIG. 11A is used, longer-wavelength light will tend to be attenuated. Narrow light guides can therefore be used as high-pass filters (passing blue light and cutting off red light). This effect may be used in combination with a color filter (e.g., a dye-based color filter) or may be used to provide a pixel with color filter capabilities.

Figure 12:
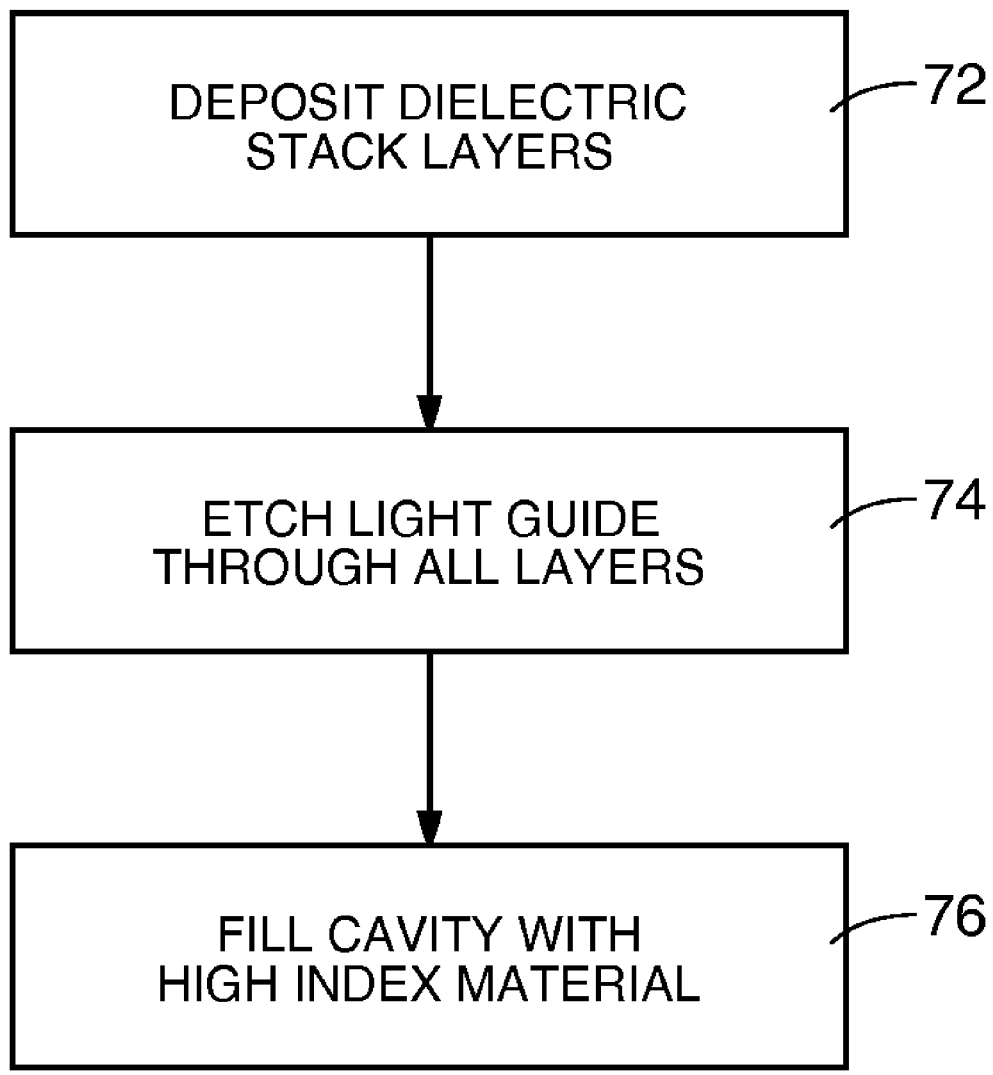
FIG. 12 is a flow chart of a conventional process for forming image sensor pixel light guides.

Steps involved in a conventional process for forming pixel light guide structures are shown in FIG. 12.

At step 72, all layers in the dielectric stack are deposited on the silicon substrate.

At step 74, an array of light guide openings are formed. The light guide openings that are formed at step 74 each pass through all of the light guide dielectric layers in the dielectric stack. The openings may be formed by etching.

At step 76, the opening in each light guide that was etched through the dielectric stack is filled with a material having an index of refraction that is elevated with respect to the unetched portions of the dielectric stack. The remaining pixel structures (e.g., the color filter array and microlens array) may then be formed to complete the image sensor.

Figure 13:
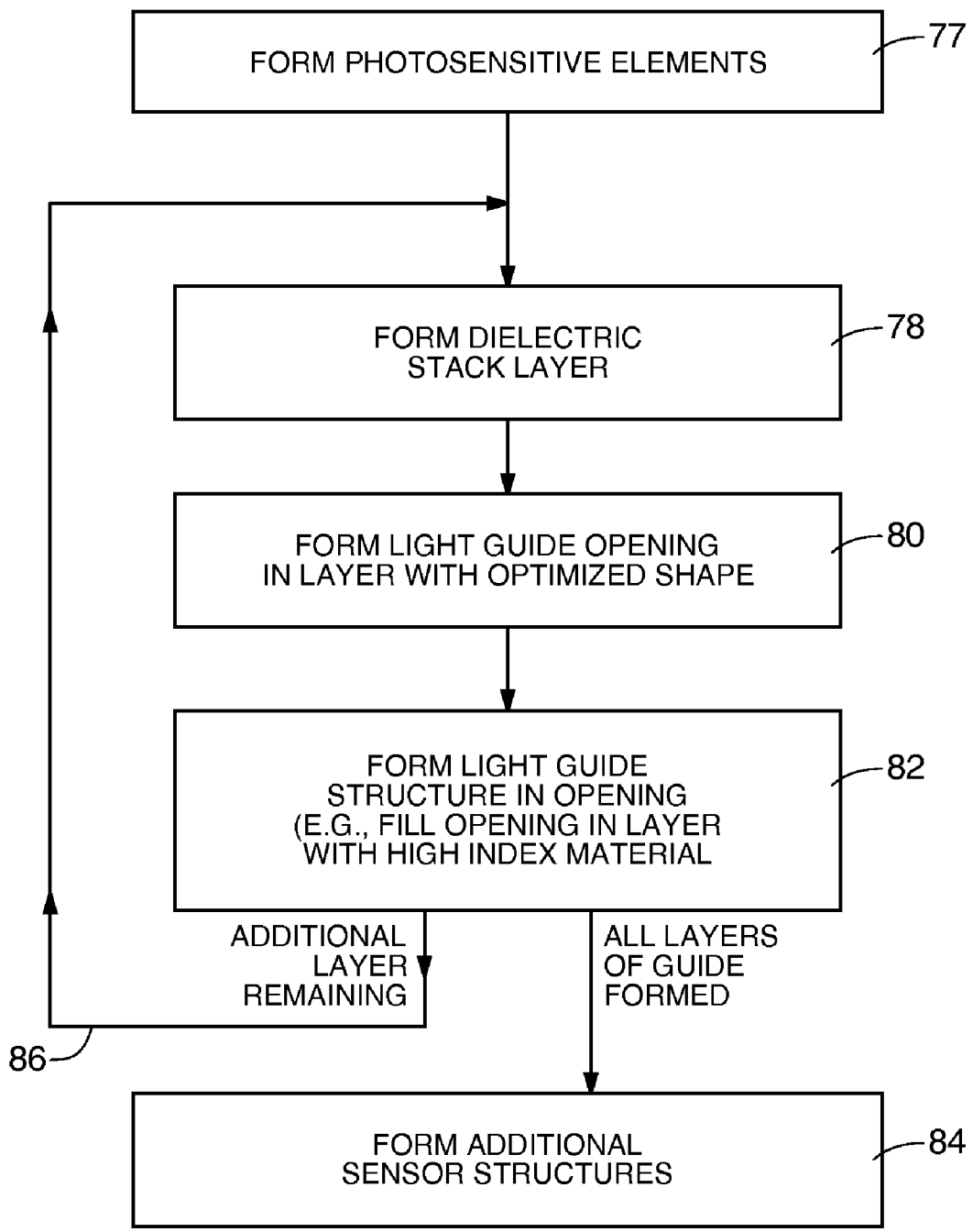
FIG. 13 is a flow chart of illustrative steps involved in forming an image sensor array with pixels having light guide structures and photosensitive elements in accordance with embodiments of the present invention.

Illustrative steps involved in forming an image sensor with light guides and photosensitive elements for image sensor 12 of device 10 (FIG. 1) are shown in FIG. 13.

At step 77, photosensitive elements such as photodiodes may be formed for the image sensor. Semiconductor fabrication techniques such as ion implantation and lithographic masking may be used in defining one or more layers of photosensitive elements. The layers may each have an n-type photosensitive region surrounded by a p+ well or other isolation structure (as an example). Tilted and untilted structures may be formed. When the photosensitive elements in different layers of the silicon substrate are laterally offset from each other, the resulting photosensitive element will be angled, which can improve quantum efficiency for off-center pixels. During the operations of step 77, photosensitive element locations can be selected to improve performance. For example, the photosensitive element locations can be selected to reduce red-blue cross-talk by increasing photosensitive element separation distance in adjoining red and blue pixels and/or the photosensitive element locations can be selected increase green channel sensitivity by decreasing the separation between the photosensitive elements in adjoining green pixels (e.g., to a distance that is less than the photosensitive element separation in adjoining red and blue pixels). Photosensitive element sizes can also be varied between pixels of different colors. For example, the photosensitive elements may tend to be more sensitive to blue light, so circuit area can be conserved (for a given number of pixels) by reducing the size of the blue pixel photosensitive elements relative to the green photosensitive elements and by reducing the size of the green pixel photosensitive elements relative to the size of the photosensitive elements in the red pixels.

At step 78, a dielectric stack layer 62 may be formed. Examples of layer formation techniques that may be used include thermal oxide growth, plasma-enhanced chemical vapor deposition, chemical vapor deposition, physical vapor deposition, etc.

After forming the dielectric layer at step 78, a light guide opening of a desired shape, size, and location within the pixel may be formed at step 80. For example, photolithographically patterned etching techniques may be used to etch an opening through the deposited dielectric layer.

At step 82, a light guide structure may be formed by filling the opening that was formed during the operations of step 82 with a dielectric material having an index of refraction that is larger than the surrounding (unetched) portions of the dielectric layer 62. A chemical mechanical polishing (CMP) step may be used to ensure that the resulting structures are planar.

As indicated by line 86, the operations of steps 78, 80, and 82 may be repeated for each of the layers in the dielectric stack. Each successive light guide opening that is formed may have a size, shape, and location that is selected to produce a desired overall shape for light guide 60. Once the entire dielectric stack and light guide have been formed, additional processing steps may be performed at step 84. For example, a passivation layer of silicon nitride may be deposited, a color filter array may be formed, and microlenses may be formed.

Various embodiments have been described illustrating an electronic device with an image sensor that has pixels containing photosensitive elements and light guides. The photosensitive elements can have positions that are adjusted to reduce cross-talk and/or increase sensitivity. The photosensitive elements can also have different sizes (e.g., color-specific sizes) within the same image sensor. Photosensitive elements may be formed from multilayer photosensitive element structures. By offsetting the photosensitive element structures within different layers, angled photosensitive element structures may be formed. The angle at which a photosensitive element tilts with respect to an axis running perpendicular to the image sensor surface may be increased for peripheral pixels to improve efficiency. Light guides may also be tilted. For example, light guide structures that are closer to the center of the image sensor may be tilted by a small angle, whereas light guide structure that are farther from the center of the image sensor may be tilted by a larger angle to improve efficiency and to allow more space for underlying metal interconnects. The upper opening of each light guide may be adjusted based on pixel location within the sensor. For example, a light guide at the center of the image sensor may have a circular upper opening to accommodate a circular spot of light gathered by a microlens, whereas a light guide at the periphery of the image sensor light guides may have an oval shape or other elongated asymmetric shape to accommodate an oval spot of light gathered by a microlens. The sizes of the light guides may be adjusted to smoothly transition between an optimum upper opening to an optimum lower opening. For example, the upper light guide opening in a given pixel may have a size and shape that is optimized to gather light from its associated microlens and may have a lower opening (exit) that matches the size of the photosensitive element in that pixel. Light guide shapes may also be adjusted to provide color filtering attributes to the image sensor.

The foregoing is merely illustrative of the principles of this invention which can be practiced in other embodiments.

What is claimed is:

1. An image sensor, comprising:
   a semiconductor substrate;
   an array of photosensitive elements formed in the semiconductor substrate, wherein each photosensitive element is associated with a respective pixel in the image sensor; and
   a dielectric stack formed on the semiconductor substrate, wherein the dielectric stack contains an array of light guides at least some of which are tilted with respect to the semiconductor substrate and each of which guides light to a photosensitive element in a respective pixel.

2. The image sensor defined in claim 1 wherein the dielectric stack contains a plurality of dielectric layers having a given index of refraction, wherein each of the dielectric layers comprises an array of light guide openings filled with a material having an index of refraction that is greater than the given index of refraction.

3. The image sensor defined in claim 1 wherein the semiconductor substrate has a planar surface, wherein the image sensor has a center, wherein each of the light guides is located at a distance from the center, wherein each of the light guides has a longitudinal axis that makes a respective angle with respect to a perpendicular axis that lies perpendicular to the surface, and wherein the angle that is made between the longitudinal axis of each light guide and the perpendicular axis varies as a function of the distance of that light guide from the center of the image sensor.

4. The image sensor defined in claim 1 wherein the image sensor has a center, wherein each of the light guides is located at a distance from the center, and wherein each of the light guides has an uppermost dielectric layer opening with a shape that depends on the distance of that light guide from the center.

5. The image sensor defined in claim 1 wherein the image sensor has a center, wherein each of the light guides is located at a distance from the center, wherein each of the light guides has an uppermost dielectric layer opening with a shape that depends on the distance of that light guide from the center, and wherein the shape of the uppermost dielectric layer opening of each light guide becomes more elongated as the distance from the center increases.

6. The image sensor defined in claim 1 wherein at least some of the photosensitive elements have longitudinal axes that are tilted with respect to the semiconductor surface.

7. The image sensor defined in claim 1 wherein the semiconductor substrate has a planar surface, wherein the image sensor has a center, wherein each of the photosensitive elements is located at a distance from the center, wherein each of the photosensitive elements has multiple layers of photosensitive element structures that are offset from each other within each photosensitive element to angle the photosensitive element with respect to the planar surface, and wherein the angle of each photosensitive element becomes larger as the distance from the center increases.

8. The image sensor defined in claim 7 wherein the image sensor comprises a color filter array having red, blue, and green color filters associated with the pixels and wherein the photosensitive elements in the pixels associated with adjoining red and blue pixels are farther apart than the photosensitive elements in the pixels associated with adjoining green pixels.

9. An array of image sensor pixels having a center, each pixel comprising:
   a photosensitive element formed in a planar semiconductor substrate; and
   a light guide that is formed in a dielectric stack above the photosensitive element, wherein each light guide is located at a distance from the center and has a longitudinal axis that makes an angle with respect to the planar semiconductor substrate, wherein the angle made by a given light guide increases with increases in the distance of that given light guide from the center.

10. The array of image sensor pixels defined in claim 9 wherein the photosensitive elements have multiple layers of photosensitive element structures so that the photosensitive elements each have a longitudinal axis that makes an angle with respect to the planar semiconductor surface, wherein the angle made by the longitudinal axis of each photosensitive element increases with increasing distance from the center.

11. The array of image sensor pixels defined in claim 9 wherein the pixels comprise pixels of at least a first color and at least a second color and wherein the photosensitive elements associated with the pixels of the first color are larger than the photosensitive elements associated with the pixels of the second color.

12. The array of image sensor pixels defined in claim 9 wherein the pixels comprise red, green, and blue pixels, wherein the photosensitive elements of the red pixels are larger than the photosensitive elements of the green pixels.

13. The array of image sensor pixels defined in claim 12 wherein the photosensitive elements of the green pixels are larger than the photosensitive elements of the blue pixels.

14. The array of image sensor pixels defined in claim 13 wherein the photosensitive elements in adjoining red and blue pixels are closer together than the photosensitive elements in adjoining green pixels.

15. The array of image sensor pixels defined in claim 13 wherein the light guide of at least some of the pixels has an elongated oval opening in the dielectric stack.

16. The array of image sensor pixels defined in claim 15 wherein each pixel comprises a microlens, wherein the light guide in each pixel is formed from a plurality of dielectric layers each of which has an index of refraction and each of which has an opening of a different size that is filled with a material having an index of refraction that is greater than the index of refraction of the dielectric layers.

17. The array of image sensor pixels defined in claim 15 wherein each pixel comprises a color filter and a microlens.

\* \* \* \* \*